United States Patent
Chou et al.

(10) Patent No.: US 7,446,510 B2
(45) Date of Patent: Nov. 4, 2008

(54) DIAGNOSIS METHOD FOR STATE-OF-HEALTH OF BATTERIES

(75) Inventors: Hung-Liang Chou, Kaohsiung (TW);
Yu-Hua Sun, Kaohsiung (TW);
Kuen-Der Wu, Kaohsiung (TW);
Chin-Chang Wu, Kaohsiung (TW);
Ming-Hsun Hsieh, Kaohsiung (TW);
Ya-Tsung Feng, Kaohsiung (TW)

(73) Assignee: Ablerex Electronics Co., Ltd., Hsintien, Taipei Hsien (TW)

( * ) Notice: Subject to any disclaimer, the term of this patent is extended or adjusted under 35 U.S.C. 154(b) by 107 days.

(21) Appl. No.: 11/655,904

(22) Filed: Jan. 22, 2007

(65) Prior Publication Data

US 2007/0252600 A1    Nov. 1, 2007

(30) Foreign Application Priority Data

Apr. 27, 2006    (TW) ............................... 95115095 A

(51) Int. Cl.
*H02J 7/16* (2006.01)
(52) U.S. Cl. .................. 320/156; 320/161; 324/427
(58) Field of Classification Search ............. 324/427, 324/433; 320/132, 134, 136, 156, 161
See application file for complete search history.

(56) References Cited

U.S. PATENT DOCUMENTS

| 6,362,601 | B1 | 3/2002 | Finger |
| 6,668,247 | B2 | 12/2003 | Singh et al. |
| 7,019,542 | B2 | 3/2006 | Tinnemeyer |
| 7,051,008 | B2 | 5/2006 | Singh et al. |
| 7,199,557 | B2 * | 4/2007 | Anbuky et al. ............. 320/132 |

* cited by examiner

*Primary Examiner*—Adolf Berhane
*Assistant Examiner*—Aaron Piggush
(74) *Attorney, Agent, or Firm*—Bacon & Thomas, PLLC

(57) ABSTRACT

A diagnosis method for SOH of batteries includes the steps of: providing data of discharge voltages and currents of a battery unit; setting an acceptable value of a predetermined period of time and an acceptable range of variation rate of discharge current for the battery unit; calculating variation rates of discharge voltages and currents of the battery unit within the predetermined period of time by using the data of discharge voltages and currents; recording the data of discharge voltages and currents of the batteries and variation rates thereof; comparing the data of discharge voltages of the batteries and the variation rates thereof if the variation rates of discharge current are fallen within the acceptable range of current variation with selected reference data; and converting results of compared data of discharge voltages of the battery unit and the variation rates thereof into a SOH index.

10 Claims, 4 Drawing Sheets

DIAGNOSIS METHOD FOR STATE-OF-HEALTH OF BATTERIES

BACKGROUND OF THE INVENTION

1. Field of the Invention

The present invention relates to a diagnosis method for state-of-health (SOH) of batteries. Particularly, the present invention relates to the diagnosis method for SOH of batteries by measuring discharge voltages and currents of a battery unit within a predetermined period of time. More particularly, the present invention relates to the diagnosis method for SOH of the battery unit by utilizing changes of discharge voltages and currents of the battery unit.

2. Description of the Related Art

Computer appliances currently require high-quality power sources. Power failure or unstable power supplies can cause serious damages of various equipment, such as workstations, medical equipment, industrial machineries etc. In order to satisfy demands of stable power or to ensure uninterrupted power, a high-quality power source such as a battery unit is used to supply electric power (as a backup power source) in the event of power failure. In addition to this, in the past, batteries as power storage devices were employed to store electric energy for use in some appliances such as communication devices, emergency illuminating devices, and power-driven vehicles etc. However, in long-term use, batteries have the problem of deterioration or aging (i.e. close to the end of its charge/discharge cycle life). In this situation, batteries are no longer supplying a reliable power. Hence, there is a need for evaluating the SOH of batteries.

There are several reasons that may result in the deterioration or aging of the lead-acid battery, including corrosion of plates of battery electrodes, deterioration of active materials of electrodes, irreversible active materials, occurrence of short circuits and loss liquid. Additionally, there exists abnormal deformation in a discharge profile during discharging the battery if the battery has aged in long-term use.

Several approaches have been currently used to determine the condition of a battery. In general, diagnosis methods for SOH of batteries include the following: analyzing an available charge capacity of a battery; analyzing discharge voltages of a battery (known as "coup de fout" method); analyzing an impedance characteristic of a battery; analyzing discharging and charging states of a battery; and analyzing method of using artificial intelligence (AI) etc. However, these methods are not accurate or reliable diagnosis methods for SOH of lead-acid batteries.

There are many factors, including charging process and method, discharging current, storage temperature and initial battery's state, which can affect the charge capacity of the battery. In addition, there is a need for employing a number of precision instruments in a method either of analyzing battery's discharge voltages or analyzing a battery's impedance characteristic. Alternatively, an analyzing procedure is sophisticated in a method of analyzing battery's discharging and charging states or an analyzing method of using artificial intelligence.

A conventional method for diagnosis of the SOH of batteries, described in U.S. Pat. No. 6,668,247, utilizes two separate necessary requirements of detecting an impedance characteristic of the battery and counting the number of complete charge/discharge cycles of the battery. The data of the impedance characteristic and the number of complete charge/discharge cycles of the battery must be calculated in a fuzzy logic system in such a way that relationships among the impedance characteristic, the number of complete charge/discharge cycles and the state of health of the battery is used to train the fuzzy logic system. However, there is a need for a number of hardware equipment (including a signal generator, an impedance measuring device and a voltage/current measuring device for example) equipped for processing such a diagnosis method of the battery's SOH. Also, there is another need for training the fuzzy logic system which has been already used to enter a great deal of data of the impedance characteristic and the number of complete charge/discharge cycles of the battery. Consequently, the fuzzy logic system can be used to determine the SOH of batteries.

As mentioned above, the diagnosis method for the SOH of batteries disclosed in U.S. Pat. No. 6,668,247 requires a highly sophisticated system. Generally, a battery has a very small value of impedance within a range of about several milliohms to about ten more milliohms for use in practicing the diagnosis method. Accordingly, the signal generator and the impedance measuring device must be precise to measure such a small value of impedance of the battery. Inevitably, there is a need of regular adjustment of precision instruments for measuring such a small value of impedance of the battery, or errors of the precision instruments may be continuously enlarged in repeatedly using them to practice the diagnosis method. In addition, many different brands or types of batteries, which have been widely used, have different characteristics. Accordingly, the fuzzy logic system must be separately trained to meet the battery characteristics of different brands or types. However, there is a need for retraining the fuzzy logic system in diagnosis of the SOH of batteries if the selected brand of battery cannot meet the battery characteristic previously designated in the fuzzy logic system. Disadvantageously, the entire procedure is highly sophisticated in practicing such a diagnosis method.

Another conventional method for determining SOH of batteries, described in U.S. Pat. No. 6,362,601, utilizes a degree of degradation of a battery plate (electrode plate) or decrease in capacity per time versus temperature in determining a float voltage of a float charging system. In this diagnosis method, a voltage of a fully charged battery at the end of the restoration charge is utilized to determine the SOH of the battery. The battery is assumed to be healthy if the determined voltage of the battery falls within a healthy state limit window at the end of the restoration charge.

As mentioned above, the diagnosis method for the SOH of batteries disclosed in U.S. Pat. No. 6,362,601 utilizes curves illustrating a battery electrode in relation to self-discharge, deep discharge and battery ageing in indicating a degree of degradation of the battery. Due to different battery characteristics of various brands or types, there is a need of showing various curves of the battery electrode in relation to self-discharge, deep discharge and battery ageing. Accordingly, the entire procedure of the diagnosis method must be repeatedly retrained and restarted. However, this diagnosis method will be only suitable for use in a float charge system and cannot meet the need of an indication for the SOH of the batteries.

As is described in greater detail below, the present invention intends to provide a diagnosis method for SOH of batteries by measuring discharge voltages and currents of a battery unit within a predetermined period of time. Changes of the discharge voltages and currents are used to indicate a degree of SOH of the battery in such a way as to directly determine the SOH of the battery, and thus to simplify the diagnosis method for the SOH of the batteries.

SUMMARY OF THE INVENTION

The primary objective of this invention is to provide a diagnosis method for SOH of a battery unit (i.e. a single battery or a string of batteries), wherein data of discharge voltages and currents of the battery unit within a predetermined period of time are collected. Variation rates in the data of discharge voltages and currents are analyzed and used to indicate a degree of SOH of the battery. Accordingly, the diagnosis method for the SOH of the battery unit is simplified.

The diagnosis method for SOH of the battery unit in accordance with an aspect of the present invention includes the steps of: providing data of discharge voltages and currents of the battery unit; setting an acceptable value of a predetermined period of time and an acceptable range of variation rate of discharge current for the battery unit; calculating variation rates of discharge voltages and currents of the battery unit within the predetermined period of time; recording the data of discharge voltages and currents of the battery unit and variation rates thereof; comparing the data of discharge voltages of the battery unit and the variation rates thereof if the variation rates of discharge current are fallen within the acceptable range of variation rates of discharge current with selected reference data; and converting results of the compared data of discharge voltages of the battery unit and the variation rates thereof into a SOH index, and displaying the SOH index.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
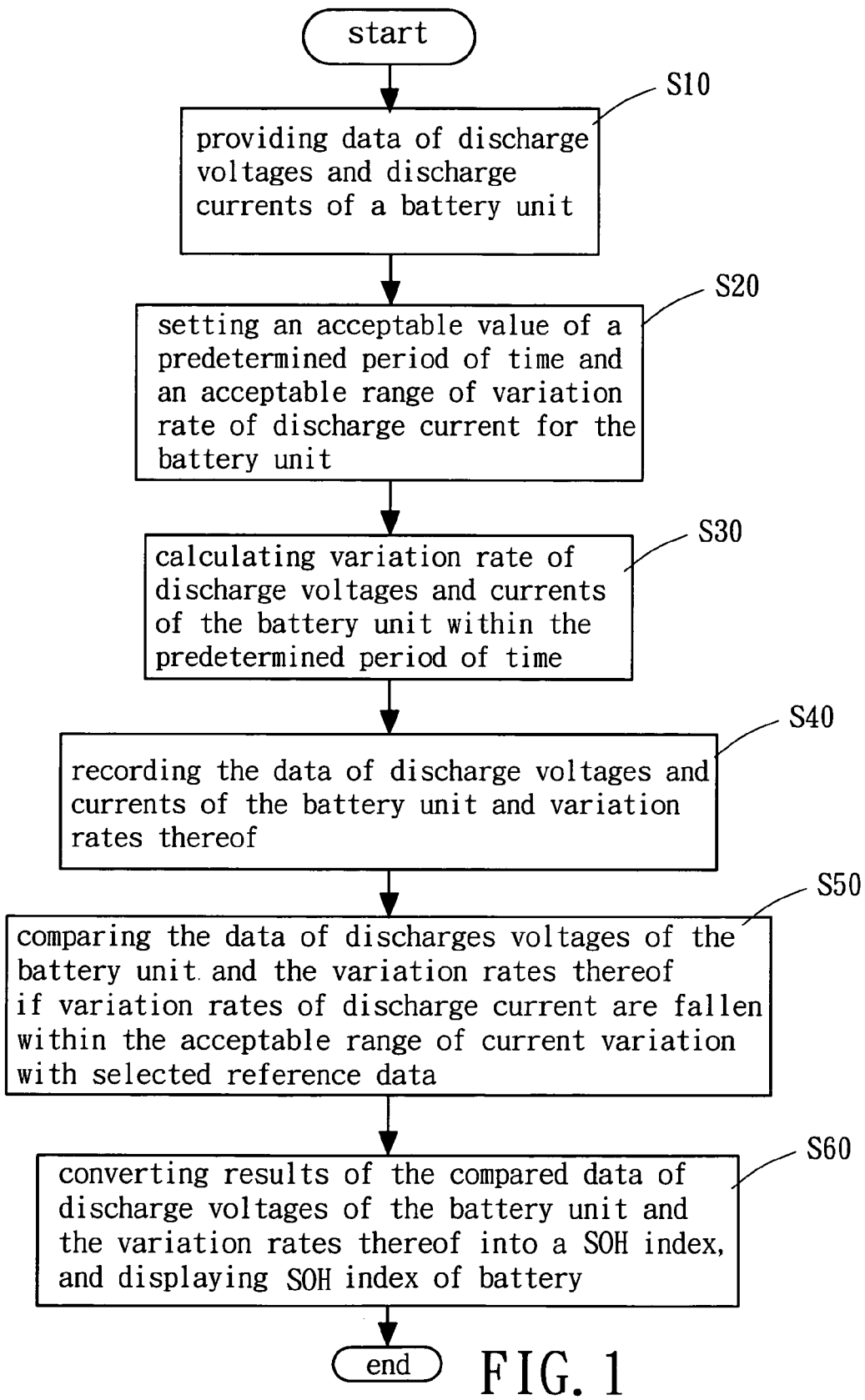
FIG. 1 is a flow chart illustrating a diagnosis method for SOH of a battery unit in accordance with a preferred embodiment of the present invention.

Turning now to FIG. 1, a flow chart of a diagnosis method for SOH of a battery unit in accordance with a preferred embodiment of the present invention is illustrated. The flow chart shown in FIG. 1 includes six steps of blocks, including a first step of block identified as S10, a second step of block identified as S20, a third step of block identified as S30, a fourth step of block identified as S40, a fifth step of block identified as S50, and a sixth step of block identified as S60.

Referring to FIG. 1, in block S10, the diagnosis method of the present invention includes the step of providing data of discharge voltages and currents of a battery unit, which is constructed from a single battery or a string of batteries. In discharging operation, an ordinary measuring device is employed to measure and retrieve the data of discharge voltages and currents of the battery unit. Subsequently, transmission means for transmitting data is preferably used to practice outputting the data of discharge voltages and currents of the battery unit from the measuring device and storing them in a database. Furthermore, the database can provide the collected data of discharge voltages and currents of the battery unit.

With continued reference to FIG. 1, in block S20, the diagnosis method of the present invention includes the step of setting an acceptable value of a predetermined period of time and an acceptable range of variation rate of discharge current of the battery. According to the needs, an acceptable value of a predetermined period of time and an acceptable range of variation rate of discharge current of the battery unit is set so as to limit the range of time period and current variation. Alternatively, the step shown in block S20 of setting an acceptable value of a predetermined period of time and an acceptable range of variation rate of discharge current of the battery unit is implemented prior to processing the step shown in block S10.

With continued reference to FIG. 1, in block S30, the diagnosis method of the present invention includes the step of calculating variation rates of discharge voltages and currents of the battery unit within the predetermined period of time by using the data of discharge voltages and currents. Prior to step S30, the predetermined period of time has been designated in step S20. Also prior to step S20, the data of discharge voltages and currents of the battery unit has been obtained in step S10. In calculating operation, increases or decreases of the discharge voltages and currents of the battery unit within the predetermined period of time are calculated to obtain variation rates of the discharge voltages and currents of the battery unit, including maximum and minimum values of the variation rates of discharge currents. In a preferred embodiment, the variation rates of the discharge voltages and currents of the battery unit are stored in a database.

With continued reference to FIG. 1, in block S40, the diagnosis method of the present invention includes the step of recording the data of discharge voltages and currents of the battery unit and variation rates thereof. In recording operation, the data of discharge voltages and currents of the battery unit and variation rates thereof are stored in the database. In a preferred embodiment, curves may be drawn by the data of discharge voltages of the battery unit and variation rates thereof.

With continued reference to FIG. 1, in block S50, the diagnosis method of the present invention includes the step of comparing the data of discharge voltages of the battery unit and the variation rates thereof if the variation rates of discharge current are fallen within the acceptable range of variation rates of discharge current with selected reference data. Prior to step S50, the data of discharge voltages and currents of the battery unit and variation rates thereof have been obtained in step S40. Also prior to step S40, the acceptable range of variation rate of discharge current for the battery unit has been designated in step S20. In step S50, many approaches can be used to compare the data of discharge voltages of the battery unit and variation rates thereof without departing from the present invention. Two preferred approaches for comparing data applied in this embodiment are as follows:

(1) Comparing the data of variation rates of discharge voltages of the battery unit with the previous data which are collected within a separate period of previous time; and (2) Comparing a set of the data of variation rates of discharge voltages of the battery unit which are collected within several separate periods of time.

Still referring to FIG. 1, in a preferred embodiment, an arithmetic operator such as a CPU device can be used to execute the step S50 of the present invention.

With continued reference to FIG. 1, in block S60, the diagnosis method of the present invention includes the step of converting results of the compared data of discharge voltages of the battery unit and the variation rates thereof into a SOH index, and displaying the SOH index of the battery unit. In a preferred embodiment, transmission means for outputting the SOH data to a display unit or an alarm unit to indicate the SOH data.

Figure 2:
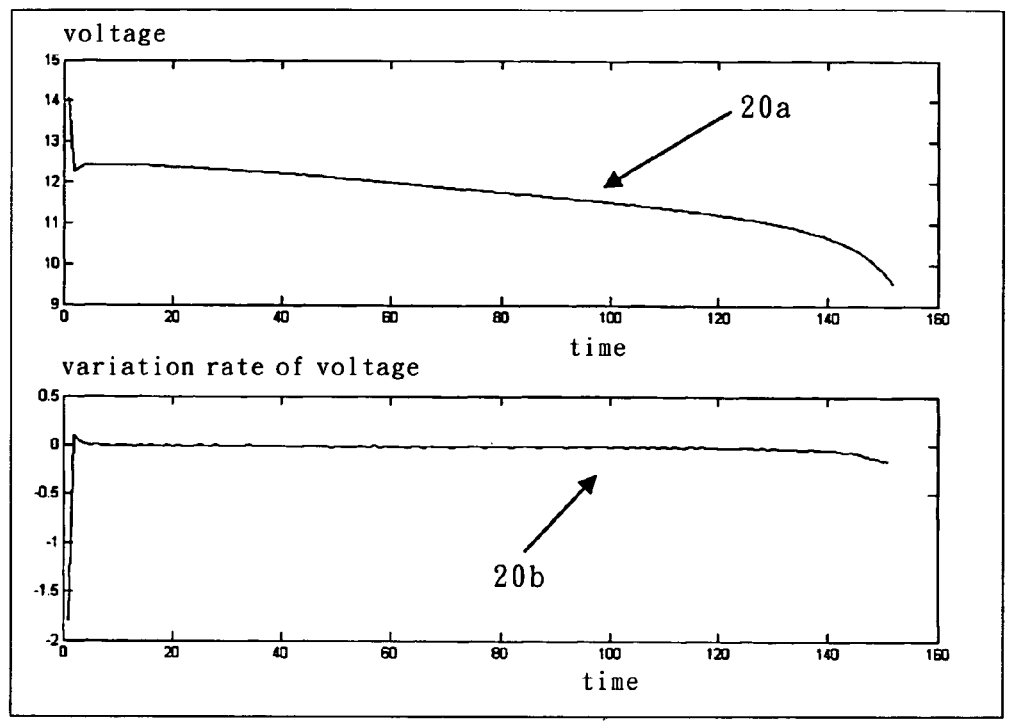
FIG. 2 is a diagram relating to discharge voltage and variation rate of a battery applied in the diagnosis method for SOH in accordance with the preferred embodiment of the present invention.

Turning now to FIG. 2, a diagram relating to discharge voltage and variation rate of a battery applied in the diagnosis method for SOH in accordance with the preferred embodiment of the present invention is shown. A curve 20a in FIG. 2 illustrates discharge voltage of the battery in relation to a predetermined period of time, wherein once discharged, there exists an abrupt voltage drop of initial discharge voltage in an instant when starting to discharge the battery. Instead of the abrupt voltage drop, the gradual decrease of discharge voltage of the battery occurs within the predetermined period of time. Correspondingly, a curve 20b in FIG. 2 illustrates the variation rate of discharge voltage of the battery in relation to a predetermined period of time illustrated in the curve 20a, wherein once discharged, there exists an abrupt change in variation rate of discharge voltage during starting to discharge the battery. Except starting to discharge the battery, changes of the variation rate of discharge voltage will be within a preferred range and a slight decrease of variation rate of discharge voltage takes place. Accordingly, the SOH of the battery can be determined "good" and no battery should be replaced.

Figure 3:
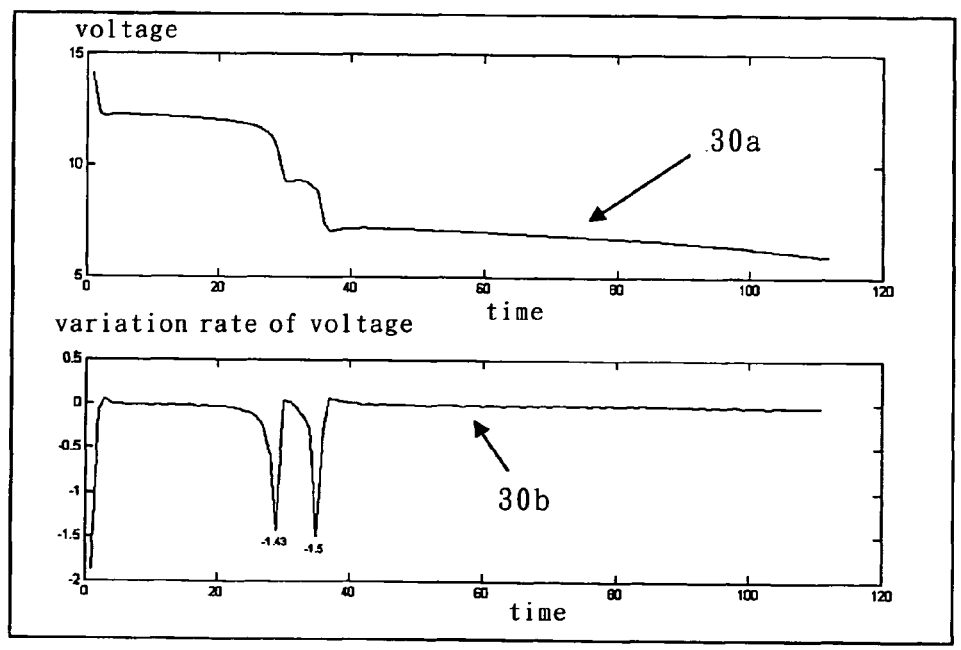
FIG. 3 is a diagram relating to discharge voltage and variation rate of another battery applied in the diagnosis method for SOH in accordance with the preferred embodiment of the present invention.

Turning now to FIG. 3, a diagram relating to discharge voltage and variation rate of another battery applied in the diagnosis method for SOH in accordance with the preferred embodiment of the present invention is shown. A curve 30a in FIG. 3 illustrates discharge voltage of the battery in relation to a predetermined period of time, wherein the abrupt voltage drop of discharge voltage occurs twice in discharging the battery in addition to an abrupt voltage drop of initial discharge voltage. After the two voltage drops, the discharge voltage of the battery becomes lower. Correspondingly, a curve 30b in FIG. 3 illustrates the variation rate of discharge voltage of the battery in relation to a predetermined period of time illustrated in the curve 30a, wherein there is a significant fluctuation of variation rate of discharge voltage when the abrupt voltage drop occurs. Changes of the variation rate of discharge voltage exceed a preset value. Accordingly, the SOH of the battery can be determined "not good" and the battery should be replaced.

Figure 4:
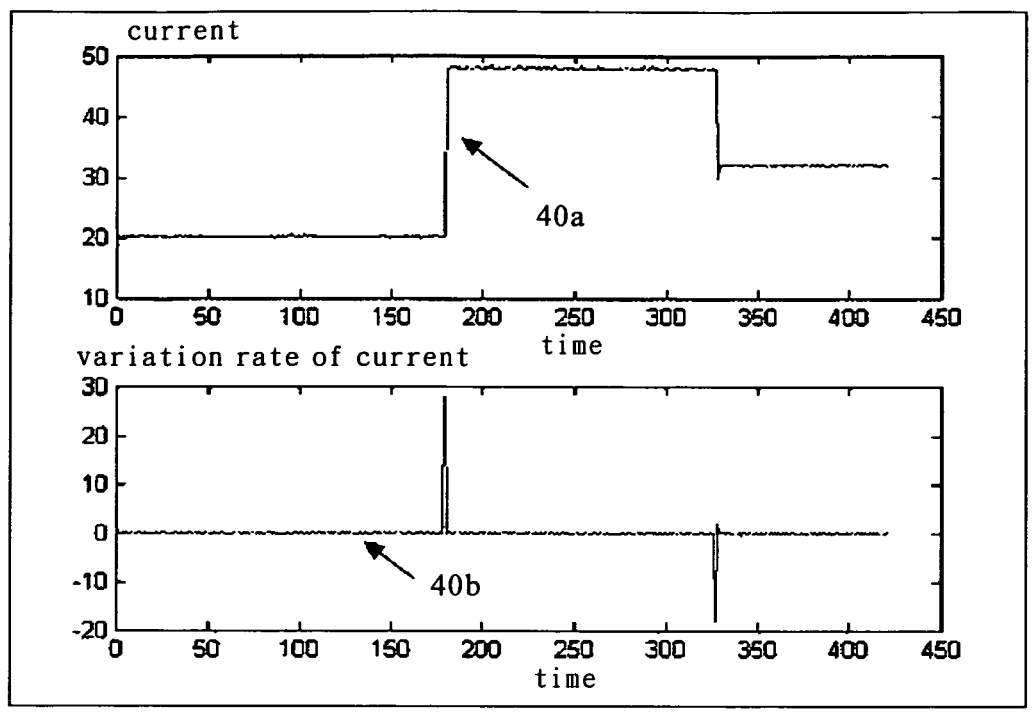
FIG. 4 is a diagram relating to discharge current and variation rate of another battery applied in the diagnosis method for SOH in accordance with the preferred embodiment of the present invention.

Turning now to FIG. 4, a diagram relating to discharge current and variation rate of another battery applied in the diagnosis method for SOH in accordance with the preferred embodiment of the present invention is shown. A curve 40a in FIG. 4 illustrates discharge current of the battery in relation to a predetermined period of time, wherein there are two significant changes in variation rate of discharge current occurred. Correspondingly, a curve 40b in FIG. 4 illustrates the variation rate of discharge current of the battery in relation to a predetermined period of time illustrated in the curve 40a, wherein there is a significant fluctuation of variation rate of discharge current when a significant change of discharge current occurs. Changes of the variation rate of discharge current fail to meet the acceptable range of variation rate of discharge current of the battery. Accordingly, the corresponding data of discharge voltage cannot be used to determine the SOH of the battery.

Figure 5:
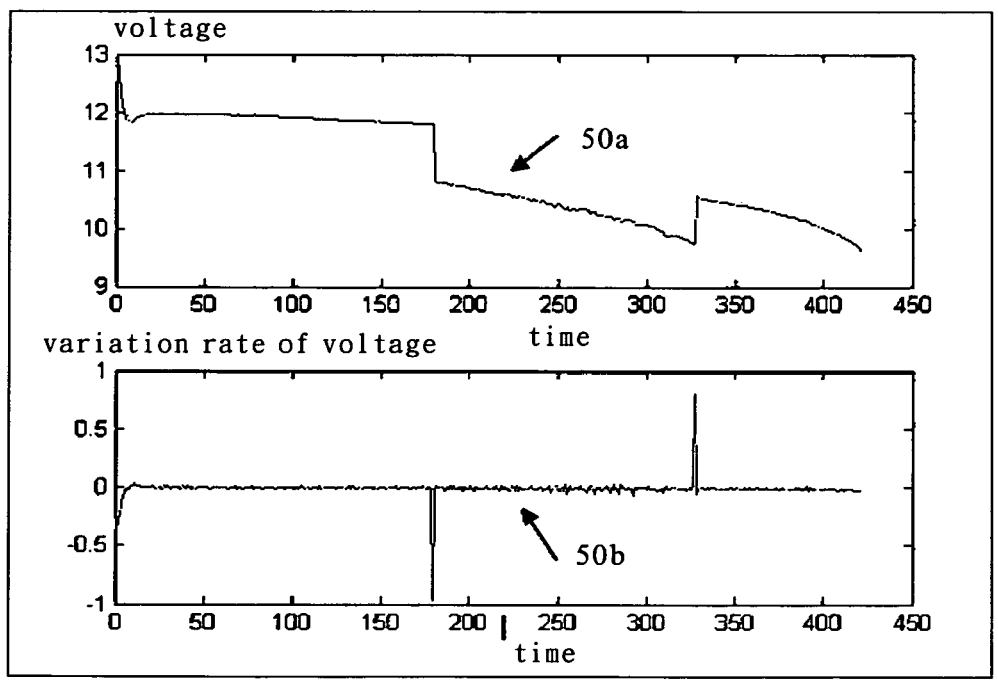
FIG. 5 is a diagram relating to discharge voltage and variation rate of the battery unit applied in the diagnosis method for SOH in accordance with the preferred embodiment of the present invention, relating to the diagram depicted in FIG. 4.

Turning now to FIG. 5, a diagram relating to discharge voltage and variation rate of the battery applied in the diagnosis method for SOH in accordance with the preferred embodiment of the present invention, for comparison with FIG. 4, is shown. A curve 50a in FIG. 5 illustrates discharge voltage of the battery in relation to a predetermined period of time, wherein the abrupt voltage change of discharge voltage occurs twice in discharging the battery in addition to an abrupt voltage drop of initial discharge voltage. Correspondingly, a curve 50b in FIG. 5 illustrates the variation rate of discharge voltage of the battery in relation to a predetermined period of time illustrated in the curve 50a, wherein there is a significant change of variation rate of discharge voltage when a significant change of discharge voltage occurs. Compared FIG. 4 with FIG. 5, the significant changes of discharge voltage and current of the battery occur at the same time. Accordingly, the data of discharge voltage cannot be used to determine the SOH of the battery due to the fact that changes of the variation rate of discharge current fail to meet the acceptable range of variation rate of discharge current of the battery.

Figure 6:
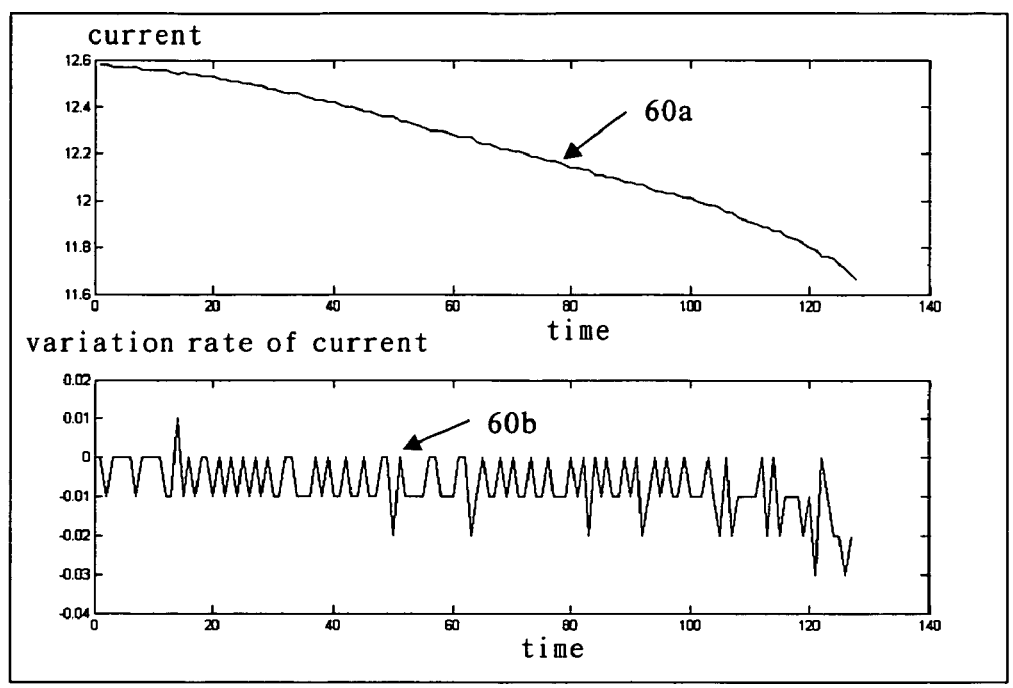
FIG. 6 is a diagram relating to discharge current and variation rate of another battery applied in the diagnosis method for SOH in accordance with the preferred embodiment of the present invention.

Turning now to FIG. 6, a diagram relating to discharge current and variation rate of another battery applied in the diagnosis method for SOH in accordance with the preferred embodiment of the present invention is shown. A curve 60a in FIG. 6 illustrates discharge current of the battery in relation to a predetermined period of time, wherein the discharge current of the battery continuously drops. Correspondingly, a curve 60b in FIG. 6 illustrates the variation rate of discharge current of the battery in relation to a predetermined period of time illustrated in the curve 60a, wherein there is a series of fluctuations in variation rate of discharge current occurred. Changes of the variation rate of discharge current are still fallen within the acceptable range of variation rate of discharge current of the battery. Accordingly, the corresponding data of discharge voltage can be used to determine the SOH of the battery.

Figure 7:
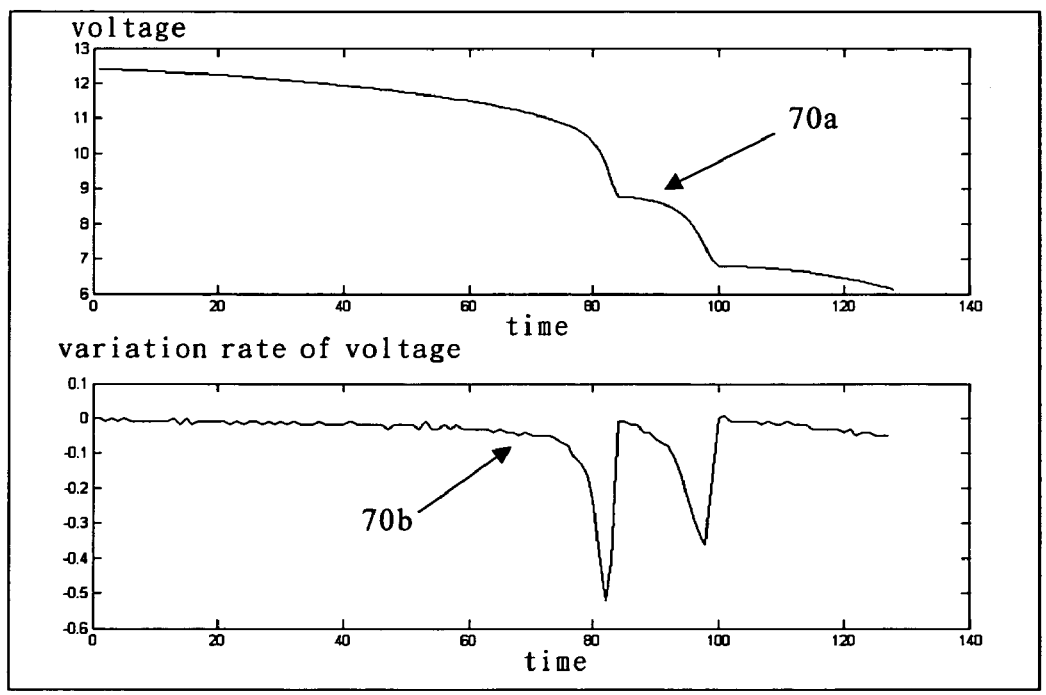
FIG. 7 is a diagram relating to discharge voltage and variation rate of the battery applied in the diagnosis method for SOH in accordance with the preferred embodiment of the present invention, relating to the diagram depicted in FIG. 6.

Turning now to FIG. 7, a timing diagram relating to discharge voltage and variation rate of the battery applied in the diagnosis method for SOH in accordance with the preferred embodiment of the present invention, for comparison with FIG. 6, is shown. A curve 70a in FIG. 7 illustrates discharge voltage of the battery in relation to a period of time, wherein the abrupt voltage drop of discharge voltage occurs twice in discharging the battery. After the two voltage drops, the discharge voltage of the battery becomes lower. Correspondingly, a curve 70b in FIG. 7 illustrates the variation rate of discharge voltage of the battery in relation to a period of time illustrated in the curve 70a, wherein there are two significant changes of variation rate of discharge voltage. Considering FIGS. 6 and 7, the data of discharge voltage can be used to determine the SOH of the battery on condition that changes of the variation rate of discharge current are still fallen within the acceptable range. Accordingly, the SOH of the battery can be determined "not good" due to the fact that changes of the variation rate of discharge voltage exceeds a preset value, and the battery should be replaced.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A diagnosis method for state-of-health (SOH) of batteries comprising the steps of:
    providing data of discharge voltages and discharge currents of a battery unit;
    setting an acceptable value of a predetermined period of time for calculating variation rates of discharge voltage and current of the battery unit, and setting an acceptable range of the variation rate of discharge current for the battery unit;
    calculating the variation rates of discharge voltages and currents of the battery unit within the predetermined period of time by using the data of the discharge voltage and current;
    recording the data of discharge voltages and currents of the battery unit and variation rates thereof;
    comparing the data of discharge voltages of the battery unit and the variation rates thereof if the variation rates of discharge current are fallen within the acceptable range of variation rate of discharge current with selected reference data; and
    converting results of compared data of discharge voltages of the battery unit and the variation rates thereof into a SOH index.

2. The diagnosis method for SOH of batteries as defined in claim 1, wherein transmission means for transmitting data is used to output the data of discharge voltages and currents of the battery unit to a designated database.

3. The diagnosis method for SOH of batteries as defined in claim 1, wherein the predetermined period of time and the acceptable range of variation rate of discharge current for the battery unit are adjusted according to various brands or types of the battery unit.

4. The diagnosis method for SOH of batteries as defined in claim 1, wherein the variation rate of the discharge voltage or the discharge current is an increase or a decrease of the discharge voltage or the discharge current within the predetermined period of time.

5. The diagnosis method for SOH of batteries as defined in claim 1, wherein the variation rates of the discharge voltages and currents of the battery unit are stored in a database.

6. The diagnosis method for SOH of batteries as defined in claim 1, wherein the SOH of the battery unit can be determined if the variation rate of discharge current is fallen within the acceptable range of variation rate of discharge current for the battery unit; alternatively, the SOH of the battery unit cannot be determined if the variation rate of discharge current fail to meet the acceptable range of variation rate of discharge current for the battery unit.

7. The diagnosis method for SOH of batteries as defined in claim 1, wherein, in the step of calculating the data, comparing the data of variation rate of discharge voltages of the battery unit with the previous data which are collected within a separate period of previous time.

8. The diagnosis method for SOH of batteries as defined in claim 1, wherein, in the step of calculating the data, comparing a set of the data of variations of discharge voltages of the battery unit which are collected within several separate periods of time.

9. The diagnosis method for SOH of batteries as defined in claim 1, further comprising the step of: displaying the SOH index of the battery unit.

10. The diagnosis method for SOH of batteries as defined in claim 1, wherein the battery unit is constructed from a single battery or a string of batteries.

* * * * *